(12) United States Patent
Kyomasu

(10) Patent No.: US 6,189,761 B1
(45) Date of Patent: Feb. 20, 2001

(54) WIRE BONDING APPARATUS

(75) Inventor: Ryuichi Kyomasu, Kodaira (JP)

(73) Assignee: Kabushiki Kaisha Shinkawa, Tokyo (JP)

( * ) Notice: Under 35 U.S.C. 154(b), the term of this patent shall be extended for 0 days.

(21) Appl. No.: 09/609,488

(22) Filed: Jul. 5, 2000

(30) Foreign Application Priority Data

Jul. 5, 1999 (JP) .................................................. 11-189961

(51) Int. Cl.[7] .............................. B23K 1/06; B23K 5/20; B23K 37/00; B23Q 15/00; B23Q 16/00

(52) U.S. Cl. ........................... 228/1.1; 228/8; 228/110.1; 228/102

(58) Field of Search ............................. 228/1.1, 18, 44.3, 228/56.2, 110.1, 102, 8

(56) References Cited

U.S. PATENT DOCUMENTS

| | | | |
|---|---|---|---|
| 3,184,842 | * | 5/1965 | Maropis . |
| 3,511,323 | * | 5/1970 | Riley, Jr. . |
| 3,602,420 | * | 8/1971 | Wilkinson, Jr. ........................... 228/1 |
| 3,681,627 | * | 8/1972 | Murry et al. ........................... 310/8.7 |
| 3,772,538 | * | 11/1973 | Supitilov ................................. 310/9.1 |
| 4,647,336 | * | 3/1987 | Coenen et al. ...................... 156/580.1 |
| 5,148,964 | * | 9/1992 | Shimizu ................................. 228/102 |
| 5,486,733 | * | 1/1996 | Yamazaki et al. ................... 310/323 |
| 6,109,502 | * | 8/2000 | Sato ........................................ 228/1.1 |

FOREIGN PATENT DOCUMENTS

| | | |
|---|---|---|
| 5-347334 | 12/1993 | (JP) . |
| 6-196532 | 7/1994 | (JP) . |
| 10-303240 | 11/1998 | (JP) . |

* cited by examiner

*Primary Examiner*—Patrick Ryan
*Assistant Examiner*—Colleen Cooke
(74) *Attorney, Agent, or Firm*—Koda & Androlia

(57) ABSTRACT

A ultrasonic horn attached to a bonding arm of a bonding apparatus via two horn supporting members. These horn supporting members, preferably made from a resin material, are separate components from the ultrasonic horn, and the ultrasonic horn and the two horn supporting members are provided so that their positional relationship in the axial direction of the ultrasonic horn can be adjusted.

2 Claims, 2 Drawing Sheets

WIRE BONDING APPARATUS

BACKGROUND OF THE INVENTION

1. Field of the Invention

The present invention relates to a wire bonding apparatus, and more particularly, to an ultrasonic horn supporting structure.

2. Prior Art

The ultrasonic horn supporting structure in a conventional wire bonding apparatus is shown in FIG. 3.

In this structure, a capillary 2 through which a wire (not shown) passes is mounted to one end of the ultrasonic horn 1, and an ultrasonic vibrator 3 is fastened to another end thereof. A flange 4 is formed on the ultrasonic horn 1 so as to positionally correspond to a node of the ultrasonic vibration, and this flange 4 is connected to a cylindrical horn supporter 5. The horn supporter 5 is fastened to a bonding arm 6, and the bonding arm 6 is fastened to a supporting shaft 7. The supporting shaft 7 is rotatably supported on a bonding head (not shown), either directly or via a lifter arm.

Examples of wire bonding apparatuses of this type are described in Japanese Patent Application Laid-Open (Kokai) Nos. H5-34734, H6-196532 and H10-303240.

Generally, as the speed of the operation of a wire bonding apparatus increases, the mechanical vibration of the ultrasonic horn also increases. In particular, vibration of the ultrasonic horn during vertical movement is a problem.

In the prior art, the ultrasonic horn is supported at one place that corresponds to a node of the ultrasonic vibration. Accordingly, the strength of the horn supporter is insufficient; and vibration of the ultrasonic horn generated by an improved speed increase of bonding apparatuses cannot be suppressed. When such vibration occurs, an excessive force applies during bonding to the ball formed at the end of the wire, resulting in an unsatisfactory shape in the crushed ball. Especially for balls having diameters reduced as a result of the use of finer pitches in semiconductor devices, this problem is difficult to deal with.

Furthermore, the flange 4 in the above prior art is integral to the ultrasonic horn 1. Since the frequency of the ultrasonic horn 1 differs from horn to horn for structural reasons, it is difficult to achieve strict alignment of the mechanically worked flange 4 with the frequency node. When a discrepancy occurs between the node position and the flange 4, the flange 4 vibrates so that a loss of vibrational energy, i.e., a so-called "leak", occurs, so that energy unrelated to the bonding conditions is consumed. As a result, the impedance increases, and oscillation that deviates from the optimal frequency occurs, thus causing a deterioration in the bonding quality. Furthermore, since unnecessary power must be injected, unnecessary ultrasonic energy continues to be applied after the completion of bonding, thus causing, for instance, an increase in unsatisfactory crushed ball shapes, stripping of balls and damage to the substrate.

SUMMARY OF THE INVENTION

Accordingly, one object of the present invention is to provide a wire bonding apparatus which reduces the vibration of a ultrasonic horn during vertical movement of the capillary.

Another object of the present invention is to provide a wire bonding apparatus which reduces the leakage of ultrasonic waves from the horn supporters, and which makes it possible to adjust the position of the horn supporters in accordance with the frequency of the ultrasonic vibration, thus increasing the energy utilization efficiency.

The above objects are accomplished by a unique structure of the present invention for a wire bonding apparatus that is equipped with an ultrasonic horn, which has a capillary attached at one end thereof and an ultrasonic vibrator attached to another end thereof, and a bonding arm to which the ultrasonic horn is attached; and in the present invention, the ultrasonic horn is attached to the bonding arm via two horn supporting members that are separate components from the ultrasonic horn, and the ultrasonic horn and the horn supporting members are provided so that their relative positions in the axial direction of the ultrasonic horn can be adjusted.

In the above structure the horn supporting members are preferably made from a resin material.

DETAILED DESCRIPTION OF THE PREFERRED EMBODIMENTS

Figure 1A:
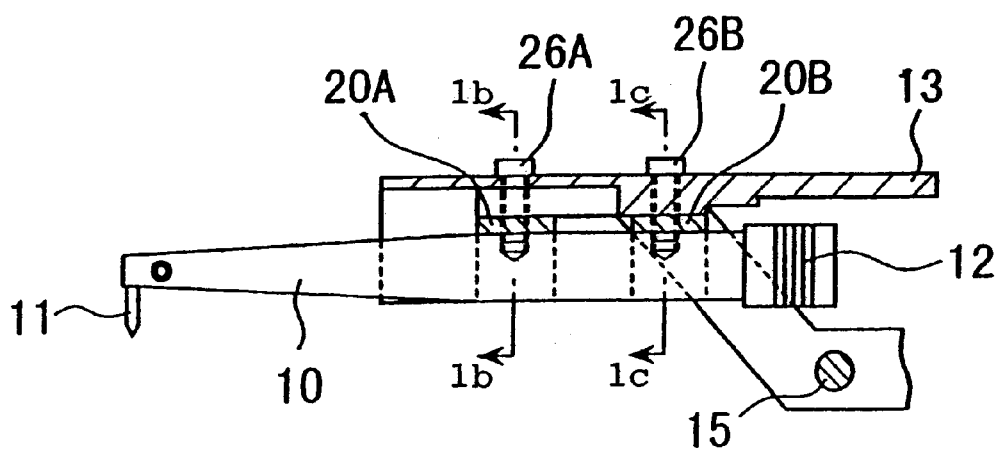
FIG. 1(a) is a longitudinal sectional view of one embodiment of the wire bonding apparatus according to the present invention.
Figure 1B:
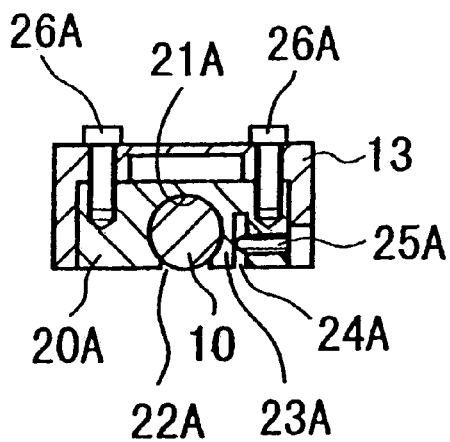
FIG. 1(b) is a sectional view taken along the line 1b—1b.
Figure 1C:
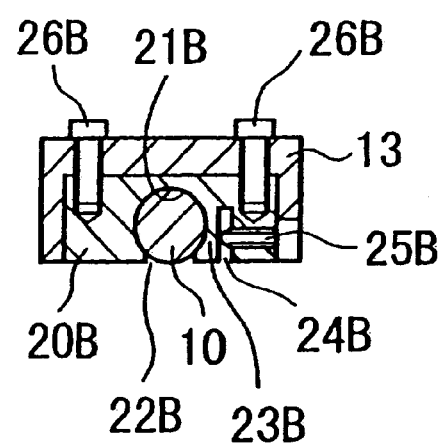
FIG. 1(c) is a sectional view taken along the line 1c—1c.

One embodiment of the present invention will be described with reference to FIGS. 1(a) through 1(b)

A capillary 11 through which a wire (not shown) passes is mounted to one end (tip end) of an ultrasonic horn 10, and an ultrasonic vibrator 12 is fastened to the another end (root end) of the horn 10. This structure is the same as in the prior art apparatus.

Two horn supporting members 20A and 20B which have the same structures are fastened to the ultrasonic horn 10. The horn supporting members 20A and 20B are formed with horn holes 21A and 21B so that the ultrasonic horn 10 is inserted therein. Also, cut-outs 22A and 22B whose widths are narrower than the diameters of the horn holes 21A and 21B are formed at the bottoms of the horn holes 21A and 21B. Furthermore, longitudinal slits 24A and 24B are formed so that thin elastic sections 23A and 23B are respectively formed in one side of each of the horn holes 21A and 21B. The longitudinal slits 24A and 24B extend in the direction of the length of the horn 10 and also extend upward from the undersurfaces of the horn supporting members 20A and 20B. Accordingly, the ultrasonic horn 10 is inserted in the horn holes 21A and 21B and fastened to the horn supporting members 20A and 20B by the elastic deformation of the elastic sections 23A and 23B that is caused by fastening bolts 25A and 25B which are screwed into the areas located outside the longitudinal slits 24A and 24B.

The horn supporting members 20A and 20B are fastened to a bonding arm 13 by attachment bolts 26A and 26B. The holes in the bonding arm 13 into which the attachment bolts 26A are inserted are formed as slots (not shown) that extend in the axial direction of the ultrasonic horn 10. As in the prior art apparatus, the bonding arm 13 is fastened to a supporting shaft 15, and the supporting shaft 15 is rotatably supported on a bonding head (not shown), either directly or via a lifter arm.

In the above structure, since the ultrasonic horn 10 is supported in two places by two horn supporting members 20A and 20B, the rigidity of the horn supporters is high, and vibration occurring during vertical movement of the capillary 11 can be reduced. As a result of the vibration being reduced, no excessive force is applied to the ball at the end of the wire (not shown) during bonding, and a consistent crushed shape of the ball is obtained.

Furthermore, since the horn supporting members 20A and 20B are separate components from the ultrasonic horn 10, the positions of the horn supporting members 20A and 20B can be adjusted to positions that corresponds to nodes of the ultrasonic vibration of the ultrasonic horn 10.

This adjustment is performed in the following manner. First, the position of the ultrasonic horn 10 is adjusted relative to the horn supporting member 20B. This adjustment is done so that the fastening bolt 25B is loosened with the horn supporting member 20B fastened to the bonding arm 13 by the attachment bolts 26B; as a result, the elastic section 23B deforms elastically toward the longitudinal slit 24B, so that the position of the ultrasonic horn 10 in its axial direction can be changed relative to the horn supporting member 20B. After an adjustment is made so that the horn supporting member 20B is positioned at a vibrational node of the ultrasonic horn 10, the fastening bolt 25B is tightened back. As a result, a part of the ultrasonic horn 10 that corresponds to a vibrational node is fastened to the horn supporting member 20B.

Next, the position of the horn supporting member 20A in the axial direction relative to the ultrasonic horn 10 is adjusted. Since the ultrasonic horn 10 is fastened to the horn supporting member 20B as described above, it is necessary to make this adjustment in regards to the horn supporting member 20A by way of moving the horn supporting member 20A. This is done by loosening the fastening bolt 25A so that the elastic section 23A of the horn supporting member 20A deforms elastically toward the longitudinal slit 24A, and further by loosening the attachment bolts 26A so that the horn supporting member 20A can be moved along the slots (not shown) formed in the bonding arm. After an adjustment is made so that the horn supporting member 20A is positioned at a vibrational node of the ultrasonic horn 10, the fastening bolt 25A and the attachment bolt 26A are tightened. As a result, the horn supporting member 20A is fastened not only to the bonding arm 13 but also to a part of the ultrasonic horn 10 that corresponds to a vibrational node.

As seen from the above, the horn supporting members 20A and 20B are of separate members from the ultrasonic horn 10. In addition, it is possible to adjust the relative positions of the horn supporting members 20A and 20B and ultrasonic horn 10. Accordingly, the positions of the horn supporting members 20A and 20B can be aligned with the positions of the vibrational nodes of the ultrasonic horn 10. As a result, the ultrasonic vibrational energy that leaks from the horn supporting members 20A and 20B can be reduced, and the ultrasonic horn 10 can be caused to oscillate at the optimal frequency, thus improving the bonding quality. Furthermore, since the horn supporting members 20A and 20B are separate components from the ultrasonic horn 10, they can be made from a different material than the ultrasonic horn 10. Thus, vibrational leakage can be further reduced by using a material such as an engineering plastic that tends not to lose ultrasonic vibrational energy.

Figure 2A:
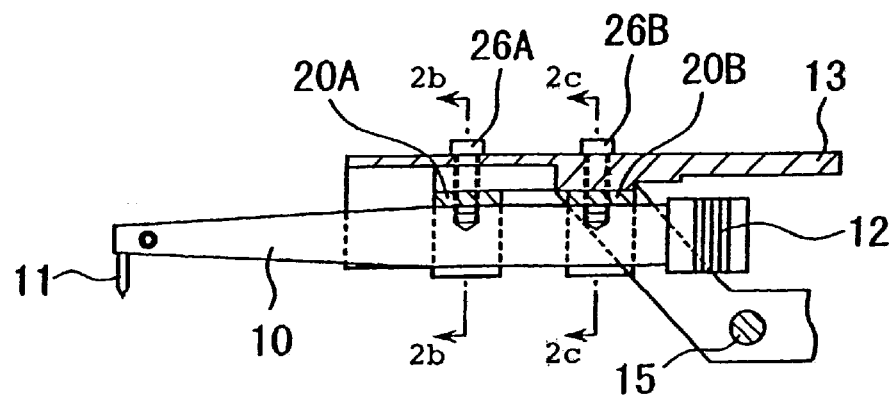
FIG. 2(a) is a longitudinal sectional view of another embodiment of the wire bonding apparatus according to the present invention.
Figure 2B:
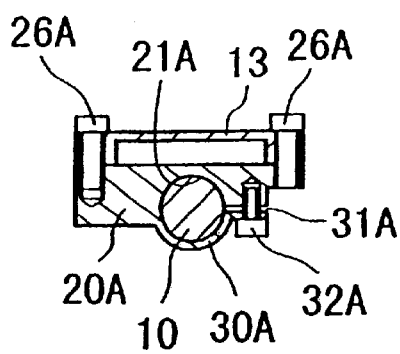
FIG. 2(b) is a sectional view taken along the line 2b—2b.
Figure 2C:
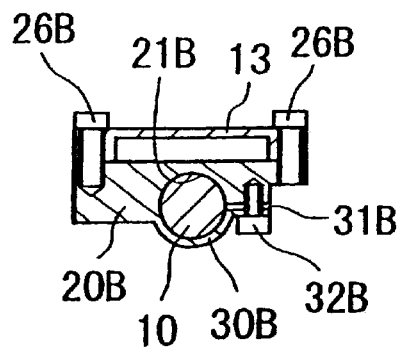
FIG. 2(c) is a sectional view taken along the line 2c—2c.
Figure 3:
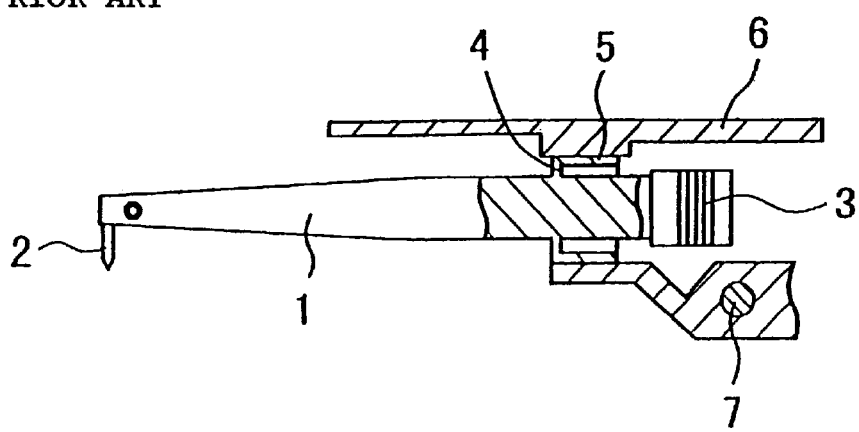
FIG. 3 is a longitudinal sectional view of a conventional wire bonding apparatus.

FIGS. 2(a) through 2(c) illustrates another embodiment of the present invention. The embodiment of FIGS. 2(a) through 2(c) differs from the previous embodiment only in the structure for fastening the horn supporting members 20A and 20B to the ultrasonic horn 10, and the remaining structure is the same.

In the horn supporting members 20A and 20B of the embodiment of FIGS. 2(a) through 2(c), the bottom surface portions that correspond to the horn holes 21A and 21B of the previous embodiment are covered with thin holding sections 30A and 30B that have an elasticity. Furthermore, lateral slits 31A and 31B are formed so as to extend into the horn holes 21A and 21B. Thus, by way of tightening fastening bolts 32A and 32B that pass through the holding sections 30A and 30B, the horn 10 is held in the horn supporting members 20A and 20B by the holding sections 30A and 30B. An effect substantially the same as that of the previous embodiment can be obtained using the structure of FIGS. 2(a) through 2(c).

As seen from the above, in the present invention which is for a wire bonding apparatus equipped with an ultrasonic horn which has a capillary at one end and an ultrasonic vibrator at another end and a bonding arm to which the ultrasonic horn is attached, the ultrasonic horn is attached to the bonding arm via two horn supporting members that are separate components from the ultrasonic horn, and the relative positions of the ultrasonic horn and the horn supporting members in the axial direction of the ultrasonic horn is adjustable. Accordingly, vibration of the ultrasonic horn during the vertical movement of the capillary can be reduced. Furthermore, the leakage of ultrasonic waves from the horn supporters can be reduced, and the positions of the horn supporters can be adjusted in accordance with the frequency of the ultrasonic vibration, thus increasing the energy utilization efficiency.

What is claimed is:

1. A wire bonding apparatus including an ultrasonic horn which has a capillary at one end thereof and an ultrasonic vibrator at another end thereof, and a bonding arm to which said ultrasonic horn is attached, wherein said ultrasonic horn is attached to said bonding arm via a plurality of horn supporting members which are separate components from said ultrasonic horn, and said ultrasonic horn and said horn supporting members are provided so that a relative position of said ultrasonic horn and horn supporting members in an axial direction of said ultrasonic horn is adjustable.

2. The wire bonding apparatus according to claim 1, wherein said horn supporting members are made from a resin material.

* * * * *